United States Patent [19]

Moloney

[11] Patent Number: 4,789,011

[45] Date of Patent: Dec. 6, 1988

[54] PIN GRID ARRAY STRAIGHTENING METHOD AND APPARATUS

[75] Inventor: Richard Moloney, Delanco, N.J.

[73] Assignee: American Tech Manufacturing, Inc., Glenolden, Pa.

[21] Appl. No.: 25,354

[22] Filed: Mar. 13, 1987

[51] Int. Cl.[4] .............................................. B21F 1/02
[52] U.S. Cl. .................................................... 140/147
[58] Field of Search ......................................... 140/147

[56] References Cited

U.S. PATENT DOCUMENTS 3,349,813 10/1967 Pastuszak ............................ 140/147
3,374,809 3/1968 Fleckenstein ....................... 140/147
3,779,291 12/1973 Yeo ..................................... 140/147

Primary Examiner—Lowell A. Larson
Attorney, Agent, or Firm—Eugene E. Renz, Jr.

[57] ABSTRACT

In an apparatus for aligning pins of PGA devices in a predetermined array of parallel rows, a comb assembly includes a plurality of tines disposed in side-by-side spaced parallel array. Adjacent tines are spaced apart a distance greater than the maximum cross section of a pin of the PGA device and a slide mechanism actuates the PGA device through the comb assembly whereby the comb tines engage between the rows of pins in the PGA device and straighten the same by a combing action. The comb tines are oriented relative to the PGA device to engage the pins along substantially their entire length.

13 Claims, 8 Drawing Sheets

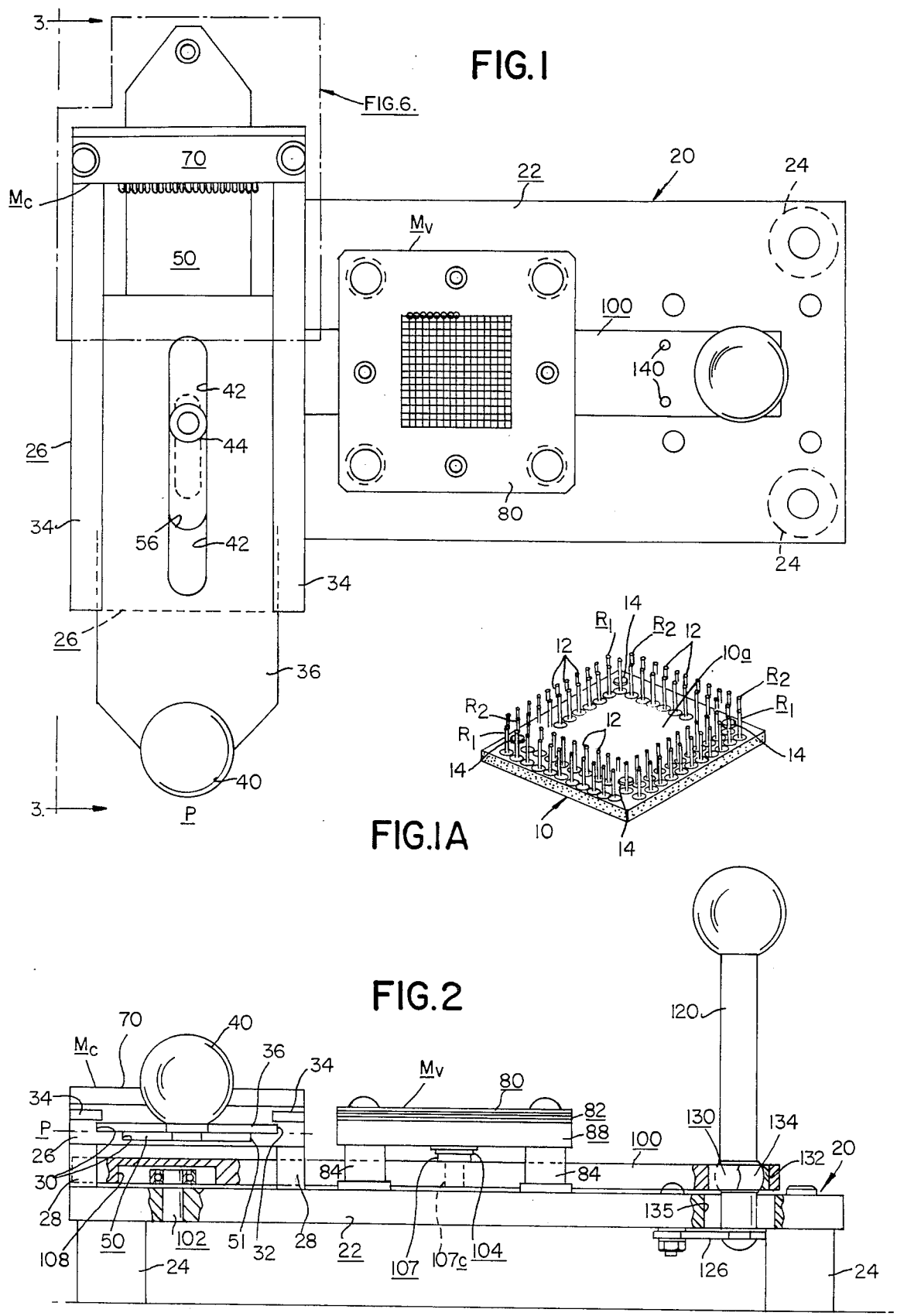

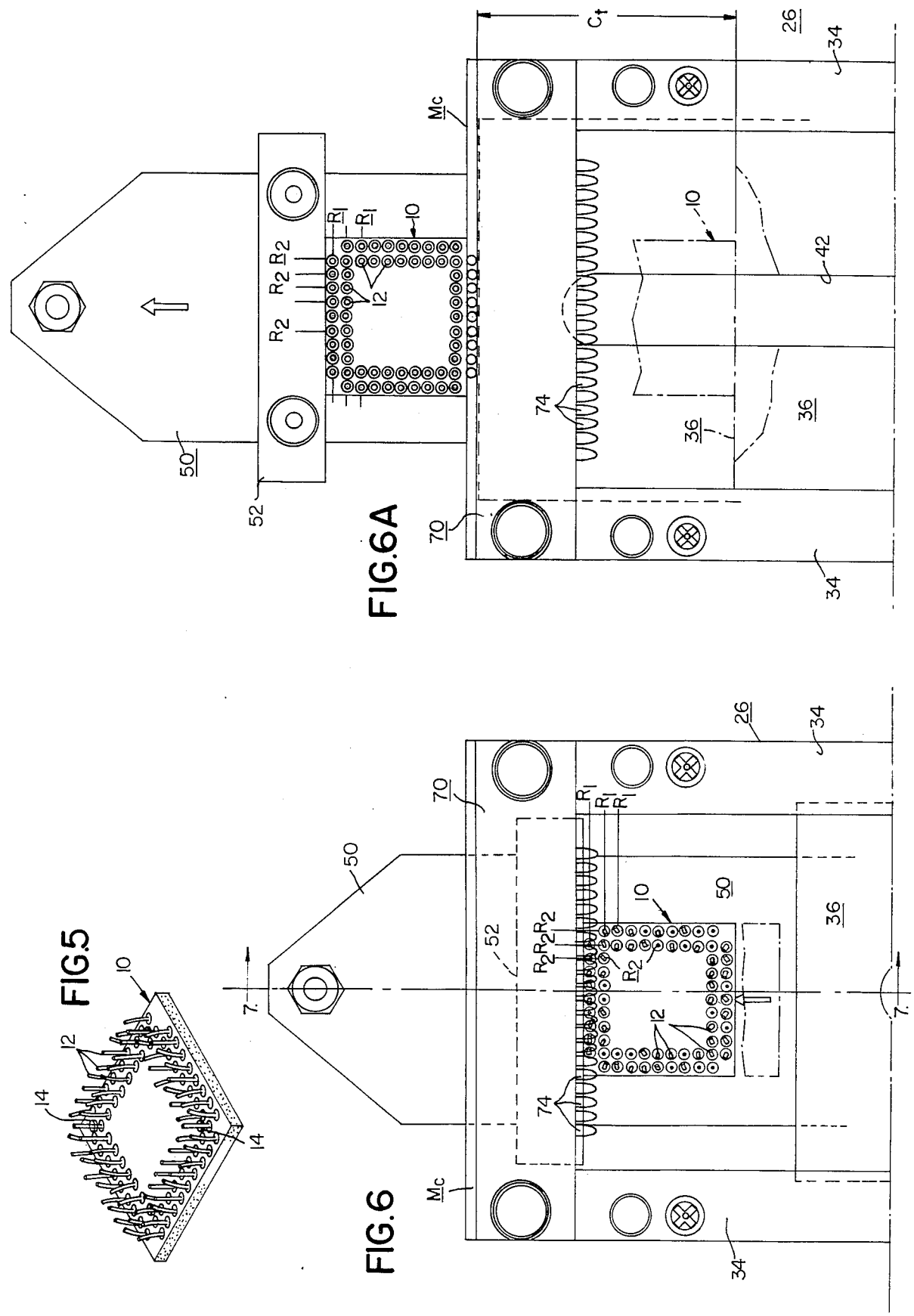

PIN GRID ARRAY STRAIGHTENING METHOD AND APPARATUS

FIELD OF THE INVENTION

The present invention relates to method and apparatus for straightening the leads or pins of electronic components, such as pin grid array devices (PGA devices).

BACKGROUND OF THE INVENTION

PGA devices typically comprise a body portion made of a moldable ceramic or plastic material having mounted therein a plurality of pins arranged in a predetermined pattern or configuration. A typical PGA device has a square body with an array of pins which are aligned in perpendicular rows parallel to the side edges of the body portion. Some of these devices include so-called stand-off collars at the base of the pin adjacent the body portion. It is important in these devices that the pin array conform to a precise specification in order to permit insertion in a predetermined array or pattern of holes or sockets in a printed circuit board (PCB). It has been found, however, that during shipment and handling, the pins tend to bend or distort to a point where the PGA device cannot be inserted in the precise pattern or array of the sockets in a PCB. Consequently, the PGA devices need to be straightened.

So-called lead straighteners are not new per se. For example, the Assignee of the present application has issued patents and pending applications in this field as follows:

| Title | Patent/ Ser. No. |
| --- | --- |
| ELECTRONIC COMPONENT LEAD STRAIGHTENING DEVICE AND METHOD | 3,880,205 |
| ELECTRONIC COMPONENT LEAD STRAIGHTENING DEVICE AND METHOD | 4,481,984 |
| APPARATUS AND METHOD FOR LEAD INTEGRITY DETERMINATION FOR DIP DEVICES | 648,872 filed Sept. 10, 1984 |
| IMPROVED APPARATUS AND METHOD FOR LEAD INTEGRITY DETERMINATION FOR DIP DEVICES | 735,857 filed May 20, 1985 |

SUMMARY OF THE INVENTION

Even though the prior devices are generally effective for the purposes intended, the PGA straightening apparatus and method of the present invention are characterized by novel features of construction and arrangement which provide certain functional advantages.

Considering the apparatus broadly in terms of function, the apparatus comprises essentially two mechanisms, a combing device to orient the pins to conform generally to specification and a grid plate mechanism to effect vernier straightening of the pins to precise tolerance specifications, that is within ±0.010" of perpendicular to the lead center and produces 0.005 pin-to-pin accuracy. The combing mechanism comprises a comb assembly composed of a series of combing tines or teeth disposed angularly above a slide assembly adapted for reciprocating actuation to move the PGA devices through the combs in two cycles to effect an initial general vertical orientation of the pins and correct grossly bent pins. The prestraightened PGA device is then placed in a straghtening grid comprised of at least two relatively movable grid plates having an array or pattern of openings for receiving the pins of a PGA device. A unique control arrangement so that operation of the control through a simple orbital motion straightens each pin so that it conforms precisely to specification.

With the foregoing in mind, an object of the present invention is to provide apparatus and method for straightening PGA devices which is versatile and portable, is easy operated even by unskilled persons to orient and straighten the leads with a high degree of accuracy and in the manner ensuring against damage to the PGA devices.

BRIEF DESCRIPTION OF THE DRAWINGS

These and other objects of the present invention and the various features and details of the operation and construction thereof are hereinafter more fully set forth with reference to the accompanying drawings, wherein:

FIG. 1 is a top plan view of a PGA straightening apparatus constructed in accordance with the present invention;

FIG. 1a is a perspective view of showing a typical PGA device;

FIG. 2 is a side elevational view partly in section of the PGA straightener shown in FIG. 1;

FIG. 5 is a perspective view of a PGA device showing the pins or leads deformed somewhat;

FIG. 6 is an enlarged fragmentary plan view showing the initial positioning of a PGA device to be straightened at the combing station and with the slide actuator in a retracted position;

FIG. 6a is a view similar to FIG. 6 showing the position of the parts after the slide actuator has moved the PGA device through the comb assembly;

DETAILED DESCRIPTION OF THE PREFERRED EMBODIMENTS

The apparatus and method of the present invention are adapted for straightening PGA devices of the type shown in FIG. 1a which typically comprise a body portion 10 made of a ceramic or plastic material which, in the present instance, is generally square, a plurality of pins 12 projecting vertically from the inner face 10a of the body portion 10. The pins are also referred to herein by the letter designation P. The pins are arranged in rows of columns R1 and R2 extending perpendicularly relative to one another. In the present instance, the array of pins comprises inner and outer columns parallel to one another and to the side edges of the body portion. In the PGA device illustrated, each pin has a stand-off collar 14 at each corner of the body portion 10. In typical PGA devices of the type which may be straightened in the apparatus of the present invention, the pins are aligned in two vertically disposed rows R1 and R2.

Figure 4:
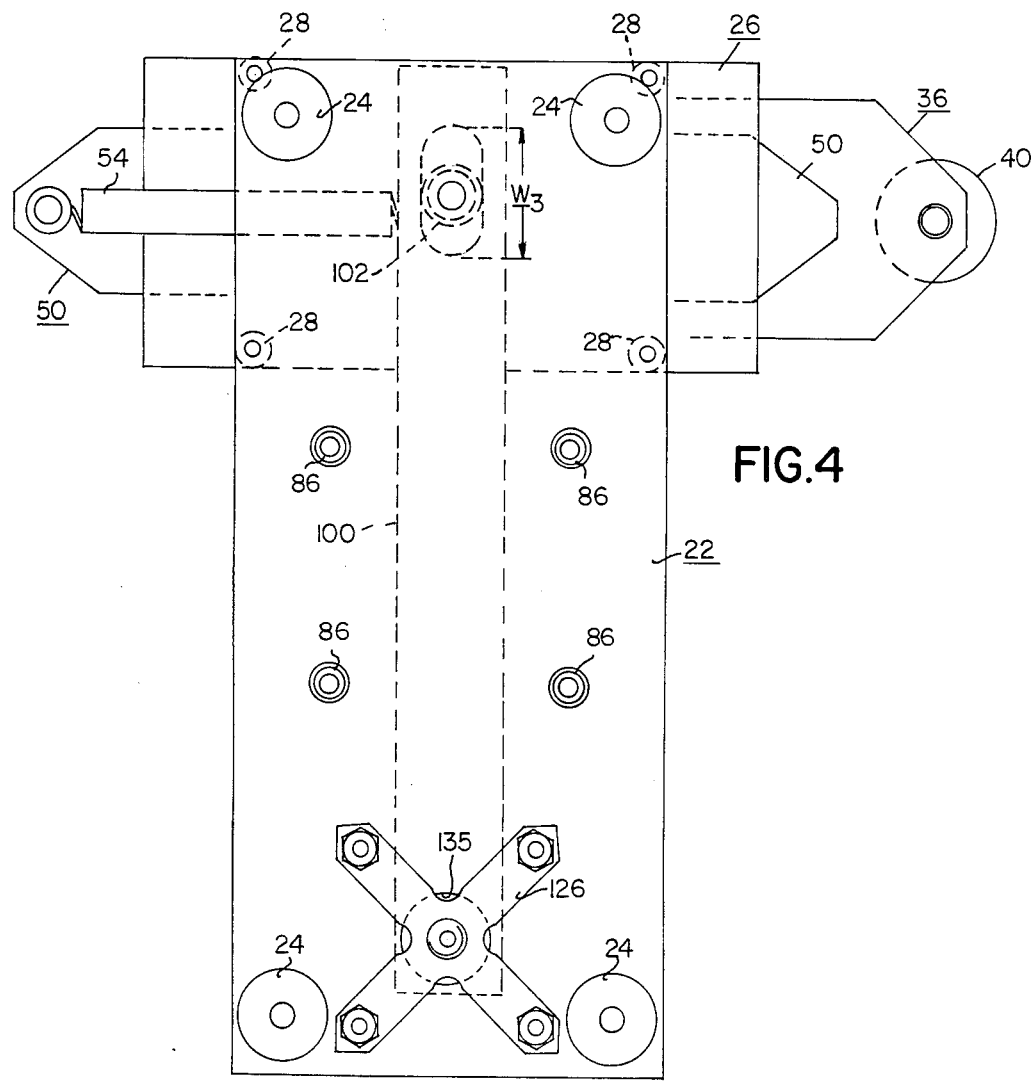
FIG. 4 is a bottom plan view of the PGA straightener of the present invention as viewed along lines 4—4 of FIG. 3.

Referring now to the drawings and particularly to FIGS. 1, 2 and 4 thereof, there is illustrated a PGA straightening apparatus in accordance with the present invention generally designated by the numeral 20. The apparatus comprises an elongated rectangular base 22 having legs 24 at the corners to support the base above a support surface or the like. With reference to FIG. 1, the combing mechanism broadly referred to as $M_c$ is located at one end of the base 22 and is actuated generally transversely thereto and the orbital vernier straightening mechanism $M_v$ is positioned centrally of the base and has an actuating mechanism extending longitudinally thereof.

Considering first the details and arrangement of the combing mechanism $M_c$, the mechanism comprises a stationary elongated generally rectangular slide base member 26 supported above the top surface of the main base 22 on pedestals or legs 28. The slide plate base 26 has raised laterally spaced rail sections 30 defining a sliding way 32. The rail sections 30 are capped by two upper rails 34 which confine sliding movement of a PGA device pusher plate 36 in a predetermined fixed plane (P—P).

Figure 3:
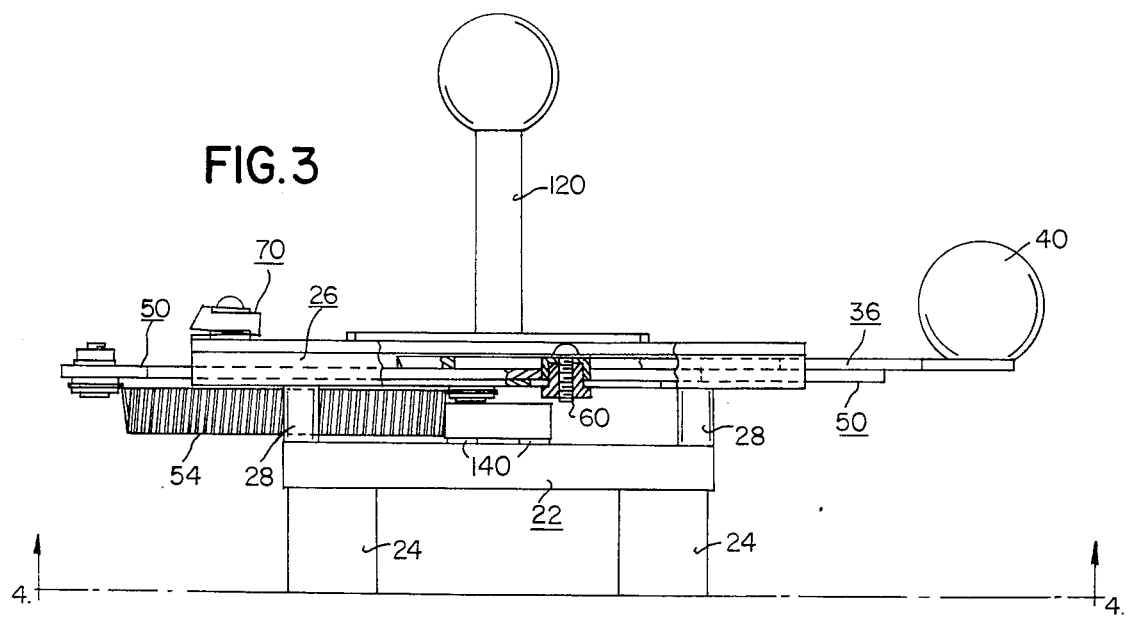
FIG. 3 is an end elevational view of the PGA straightener.

The slide has an actuating knob 40 at one end and has an elongated longitudinally extending slot 42 which cooperates with an adjustable slide screw 44 in a manner to be described in more detail below to limit the retracted and extended limit positions of the pusher plate 36. The combing mechanism $M_c$ further includes a front guide plate assembly 50 adapted for sliding movement in the way 32 defined in the slide plate base 26 below the pusher plate 36. As best illustrated in FIG. 6a, the front guide slide has a transversely extending guide plate 52 mounted on the top face thereof against which the PGA device abuts during cycling through the comb assembly. The front slide guide is normally spring biased to the home position shown in FIG. 6 by spring 54 connected at its outer end to the front slide guide plate and at its inner end to the slide plate base 26 (see FIG. 3). The inner home position of the front slide plate 50 is selectively adjustable and preferably set so that for a given PGA device, the frontmost row facing the comb assembly just engages the combs in the position illustrated in FIG. 6. This provides a minimal lead entry for the pins into the combs to ensure that pins are aligned properly and engage between the combs and do not bump them head on. To accomplish this, the inner end of the slide guide plate 50 has an elongated slot 56 formed therein. A slide screw 60 is adjustably mounted in a longitudinal slot in the slide base plate 26 and when the inner end of the slot 56 in the front slide plate abuts the slide screw, the position of the front guide plate edge relative to the comb assembly is determined. Note that the spring 54 normally biases the front slide plate in a direction opposite the arrow in FIG. 6a and toward the slide in a direction toward the comb assembly.

Figure 7:
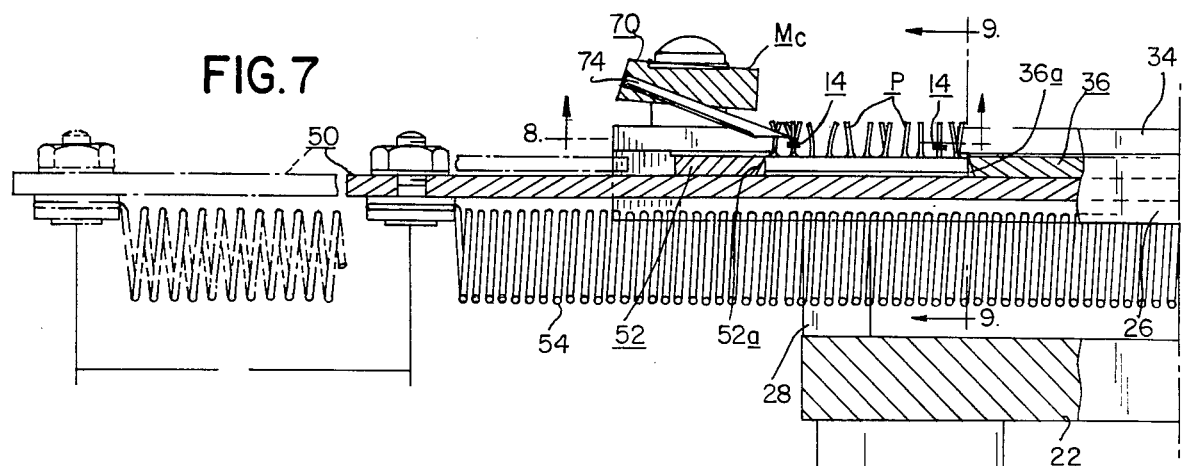
FIG. 7 is a sectional view taken on lines 7—7 of FIG. 6 showing the relative positioning of the parts of the comb assembly at the start of a combing cycle.
Figure 8:
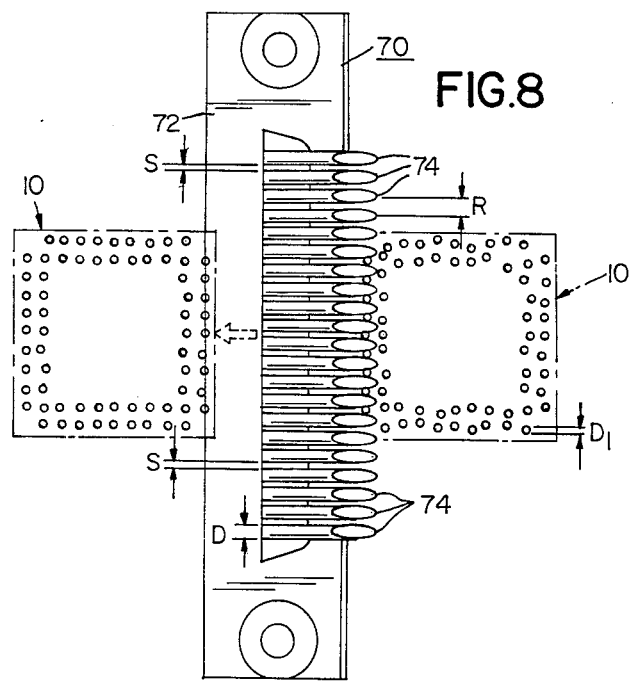
FIG. 8 is a bottom plan view taken on lines 8—8 of FIG. 7.
Figure 9:
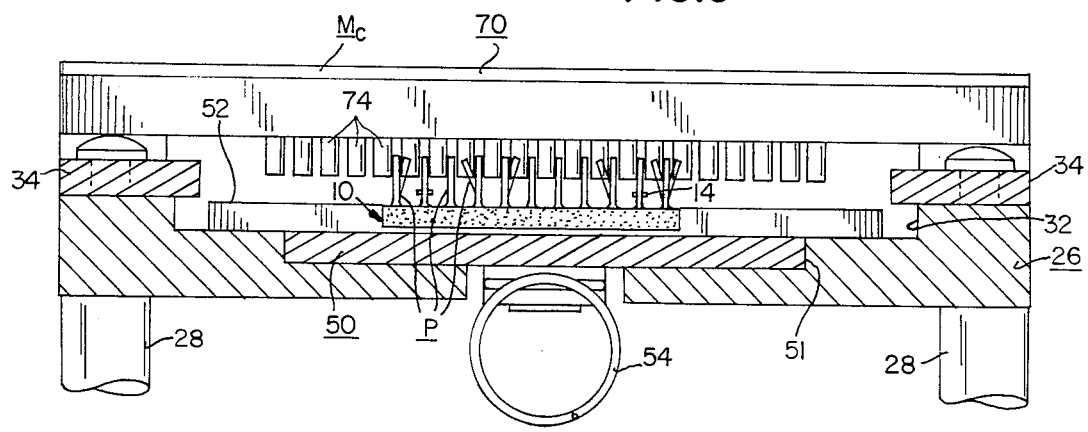
FIG. 9 is an enlarged sectional view taken on lines 9—9 of FIG. 7.

As best illustrated in FIGS. 7, 8 and 9, the comb assembly 70 comprises an elongated bar 72 mounted above the slide assembly in a manner permitting height adjustment to accommodate PGA devices of different configurations and cross sections. The bar 72, as illustrated, mounts a plurality of straightening tines 74 extending downwardly at an angle. The tines are of circular cross section and spaced relative to one another to provide a predetermined clearance between adjacent tines 74 of the comb assembly and a pin in the PGA device. The straightening tines, as best illustrated in FIG. 8 are elliptically-shaped at their free terminal end face to provide a widened entry ramp R between adjacent tines and, in this manner, ensure separation of the rows of pins and produce a good straightening action as the PGA devices pass through the combing station. The smallest spacing 5 between adjacent straightening tines is slightly larger than the greatest pin diameter $D_p$ of a PGA device. The elliptical shape of the tines provides a certain tolerance for out-of-alignment configuration of the leads. Note that the angular configuration of the straightening tines 74 is important because it positions the tips of the straightening tines slightly above the stand-off shoulders adjacent the juncture of the pins P to the body portion of the PGA device. Accordingly, as the PGA device is moved through the comb assembly in the manner shown in FIGS. 7 and 8, the pins P of the PGA device are straighened by engagement with the straightening tines 74 over their entire length to produce a good straightening action and also to minimize jamming.

Consider now a typical combing cycle. For a given PGA device, the slide screw is set so that the front slide guide is urged by the biasing spring to its correct position relative to the comb assembly, that is one wherein the outermost row of pins is slightly engaged with the tip ends of the straightening tines 74 as shown in FIG. 7. With the PGA device in place, and the pusher plate 36 in a retracted position, the user simply grasps the actuating knob 40 and moves the pusher plate 36 until it abuts the rear edge of the pody portion of the PGA device. Continued movement of the pusher plate forward advances the PGA device through the combing station to the position shown in FIG. 6a. Note that the spring bias maintains a tight engagement of the PGA device between the front guide plate 52 and the forward edge of the pusher plate 36. The front edge of the front guide plate 52 which confronts the PGA device and the forward edge of the pusher plate are preferably cut back to define a downwardly tapered faces 52a and 36a, respectively, to provide a good gripping action with the body portion of the PGA device (see FIG. 7). The pusher plate 36 is then retracted rearwardly and the bias of the spring will move the front guide plate 52 rearwardly back through the comb assembly. The PGA device is now rotated 90° and centered relative to the comb assembly and the process repeated to align the pins in both rows R1 and R2.

The PGA device now has been preconditioned and is ready for the final vernier straightening in the grid plate assembly which will be described in more detail hereinafter.

Figure 11:
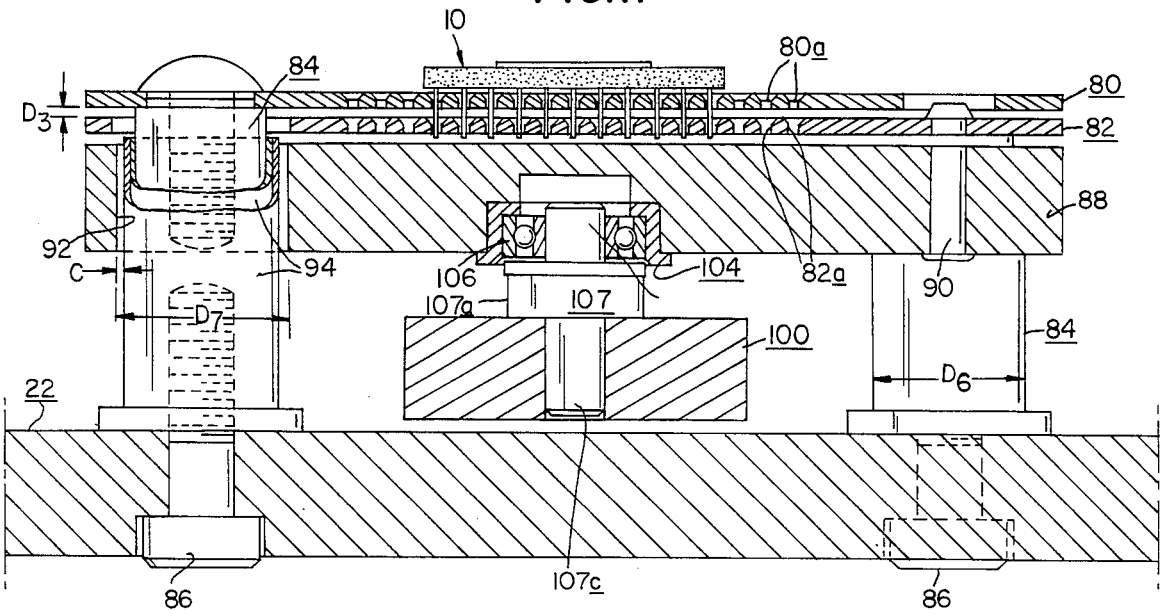
FIG. 11 is an enlarged stepped sectional view taken on lines 11—11 of FIG. 10 showing the details of the grid plate assembly.

The structural details and arrangement of the vernier straightening mechanism $M_v$ of the apparatus are best shown in FIGS. 2, 4 and 11. Considering first the basic elements of the vernier straightening mechanism in terms of funtion, the mechanism includes two cooperating grid plates 80, 82, each having a pattern of openings 80a, 82a of circular cross section having diameter $D_4$ and arranged in rows $R_a$, $R_b$. The spacing and orientation of the openings 80a, 82a are matched to the size and orientation of a given PGA device so that the pins fit with a predetermined clearance. The movable grid plate 82 is adapted for controlled limited orbital movement relative to the fixed grid plate 80 in a manner to orient the pins in precisely the desired angular orientation relative to one another for proper insertion in a PCB. Considering now more specifically, the structural details and arrangement of the vernier mechanism $M_v$ and with particular reference to FIG. 11, the upper grid plate 80 is fixedly mounted to its four corners to posts 84 at a predetermined distance above the main base plate 22. The posts 84 are secured in place to the base plate by means of screws 86 which engage the lower ends. The mechanism further includes a lower movable grid plate 82 spaced at a predetermined distance below the upper fixed grid plate 80 and secured to an actuator plate 88 by rivets 90. Note the actuator plate 88 underlies the grid plates and has four openings 92 circumscribing the post 84 with a predetermined clearance C. The actuator plate 88 and the low grid 82 plate move together as a unit and describe a limited orbital path relative to the fixed upper grid plate 80 as determined by the clearance C between the actuator plate openings 92 and the posts 84. This clearance C may be selectively varied by utilizing sleeve-shaped shims 94 which circumscribe the posts 84. The radial clearance between the posts and/or shims and the openings 92 is selected for a given PGA device and the grid plates which are utilized for a given PGA device are a function of the pin pattern of the device and the pin cross sectional dimension. It is noted that the actuator plate and grid plates are easily and readily replaceable so that the apparatus may be readily converted when necessary to run a straightening operation for a wide variety of PGA devices.

The vernier mechanism $M_v$ further includes means for actuating the grid plates relative to one another in the orbital path shown schematically in FIGS. 13a–13e inclusive to effect the final straightening action of PGA devices. As best illustrated in FIG. 2, the actuating system includes a motion transfer bar 100 connected at one end by means of a bearing pivot broadly designated by the numeral 102. The center of the bar, as illustrated in FIGS. 2 and 11, is operatively connected to the carrier or actuator plate by means of a rotary pivot 104 in the form of a radial ball bearing 106. More specifically, the outer terminal end of the motion transfer bar 100 has an elongated slotted opening 108 formed therein having a length $W_3$ slightly greater than the diameter of the bearing pivot 102. This allows a limited longitudinal and rotary movement of the bar at this end. The rotary pivot 104 as shown in FIG. 11 comprises a connector element 107 and generally T-shaped configuration having an enlarged central portion 107a and two oppositely directed stub shafts 107b and 107c. The stub shaft 107c is press fitted in the motion transfer bar 100 and the stub shaft 107b mounts a radial bearing 106 which, in turn, is seated in a cap mounted centrally of the actuator plate 88. The opposite end of the actuator plate mounts a control stick 120 which, in turn, is flexibly mounted to the base at its lower end on a spider 126 made of a plastic material which, in turn, is supported below the base plate in the manner illustrated in FIGS. 2 and 4. The control stick has a spherical bearing portion 130 which engages in a bearing sleeve insert 132 in the motion transfer bar 100 which has a complementary spherical raceway seat 134. In this fashion, the control stick may be moved in a limited universal manner relative to the motion transfer bar 100. Small plastic buttons 140 are mounted on the lower face of the transfer bar adjacent the control stick and at the opposite terminal end thereof to ensure smooth, trouble-free operation and minimize frictional drag and in this manner the spider returns the control stick to a truly vertical position when it is released and, in turn, the upper and lower grid plates are automatically moved to their home position wherein the openings are aligned as shown in FIG. 11. The base plate 22 has an enlarged opening 135 circumscribing the lower terminal end of the control stick 120 adjacent its connection to the spider 126 to provide ample unobstructed clearance for the limited oscillating movement of the lower end of the control stick during actuation thereof in the manner described above.

Figure 10:
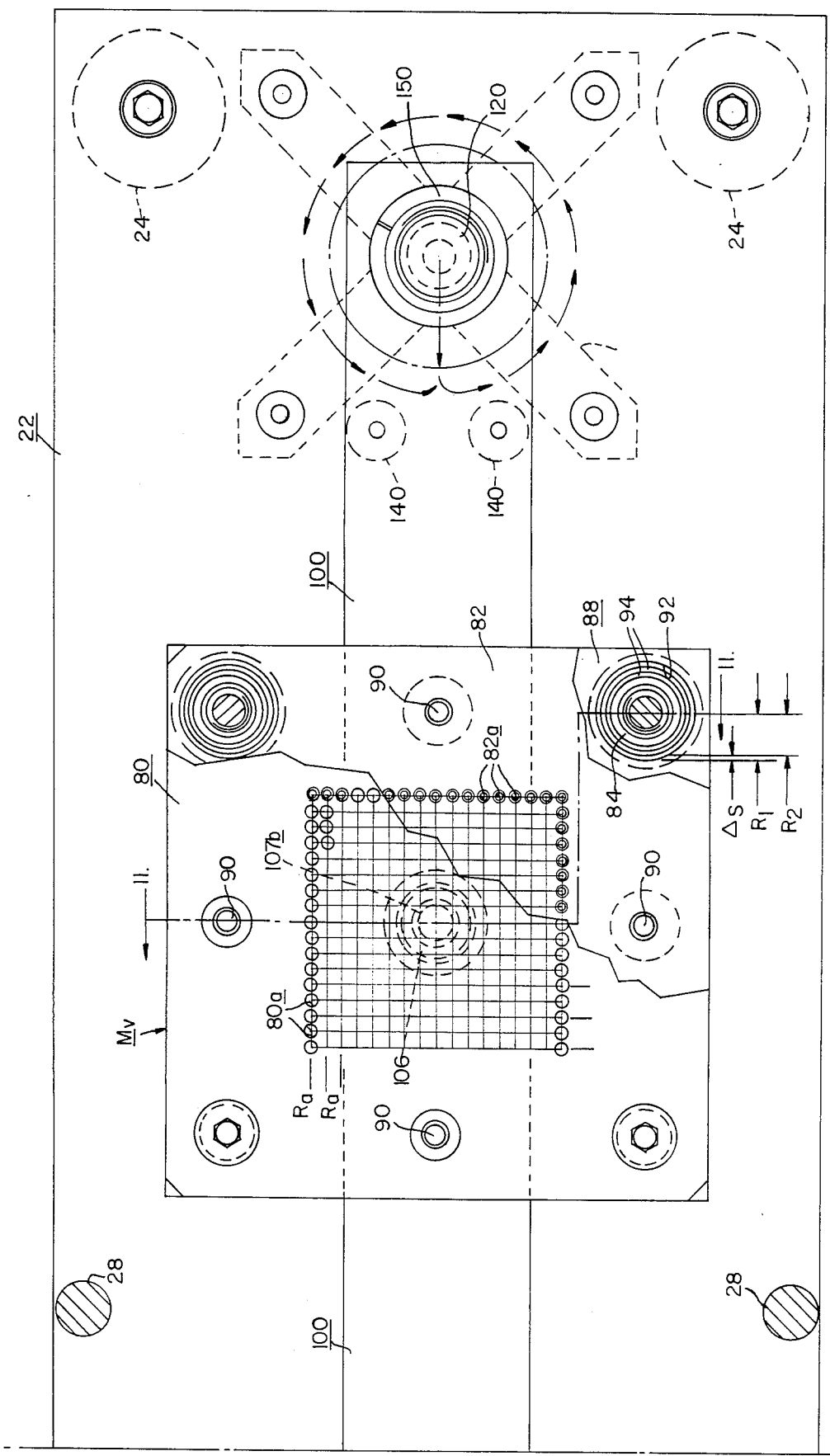
FIG. 10 is an enlarged plan view of the vernier straightening mechanism of the apparatus.
Figure 12:
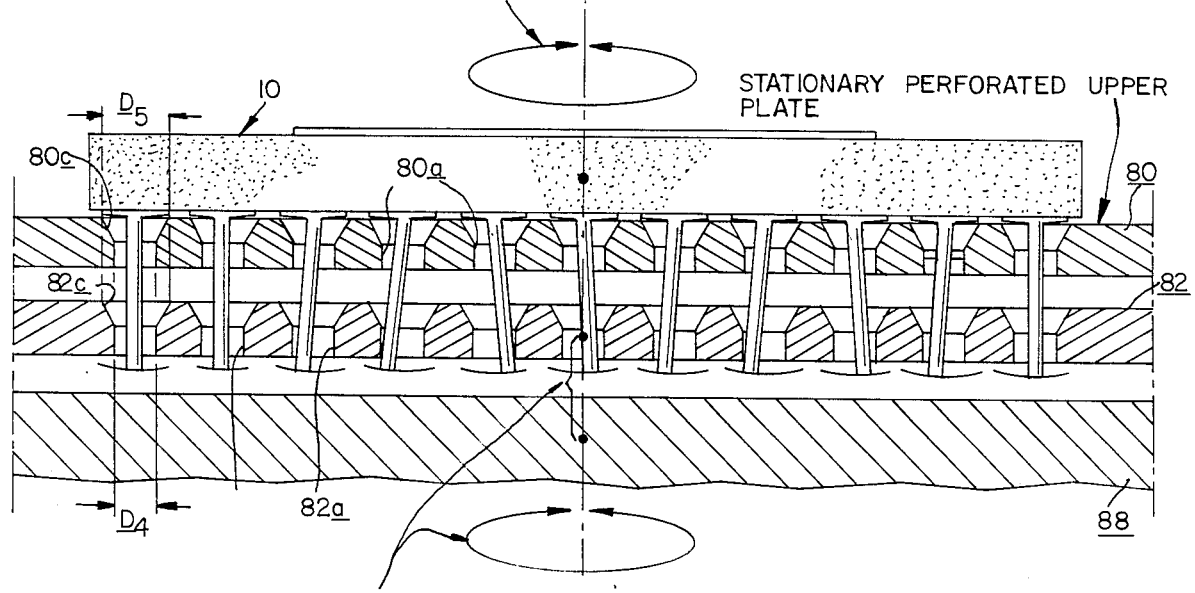
FIG. 12 is an enlarged fragmentary view showing the fixed and movable grid plates.
Figure 13A:
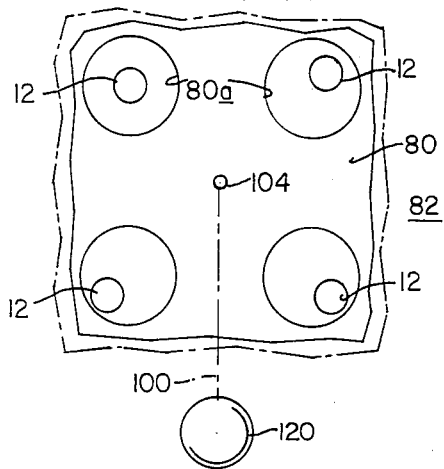
FIGS. 13a–13e inclusive are fragmentary schematic illustrations illustrating the principle of operation of the vernier grid plate assembly straightening mechanism.
Figure 13B:
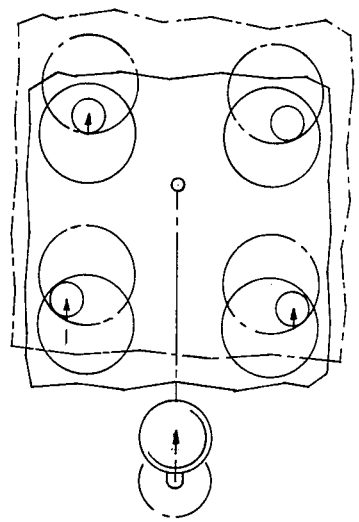
Figure 13C:
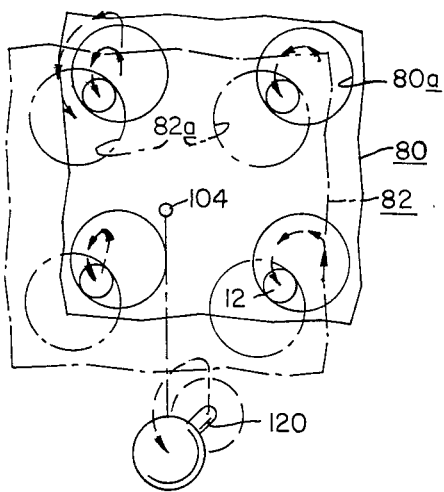
Figure 13D:
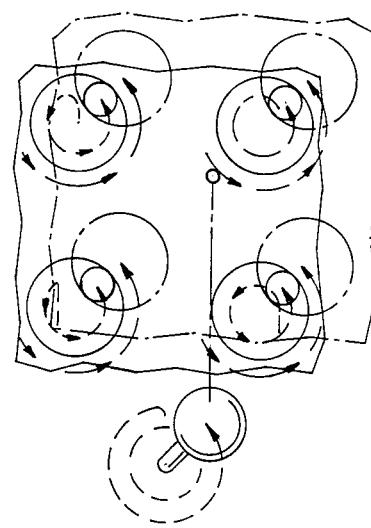
Figure 13E:
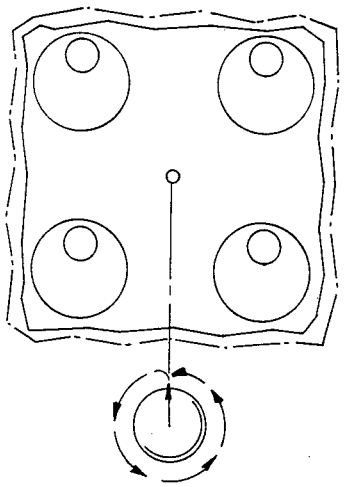

PGA devices requiring only vernier straightening are simply inserted generally centrally of the grid plate array in the manner as shown in FIG. 11. FIG. 12 shows the leads prior to initating the vernier straightening cycle. Note that the openings in the grid plates have a beveled entry section 80c, 82c to facilitate insertion of the PGA device. The control stick is now simply rotated by the user in an orbital path as shown in FIG. 10. This action on the control stick effects through the motion transfer bar relative orbital and transitilory motion of the gird plates relative to one another in the manner shown schematically in FIGS. 13a–13e inclusive. Note that the clearance C between the actuator plate openings and the posts ensures that the minimum clearance between the openings in the grid plates for each pin is never less that the diameter $D_p$ of the pin and thus a highly accurate straightening action of the pins relative to one another is produced. Note that during the rotary motion of the control stick 120, the fixed and movable plates are actuated relative to one another thereby displacing the corresponding openings of the movable and fixed grid plates in a manner to produce a rotary force on each pin to position it in a precise vertical alignment within the specification tolerances required. The finalized straightening operation positions the pins in the row alignments required for proper insertion in a PCB. The application of force in the grid action is such as to minimize or eliminate the effect of spring-back for pins which are straightened from a bent condition to the specification condition during the vernier straightening action described above.

Figure 14:
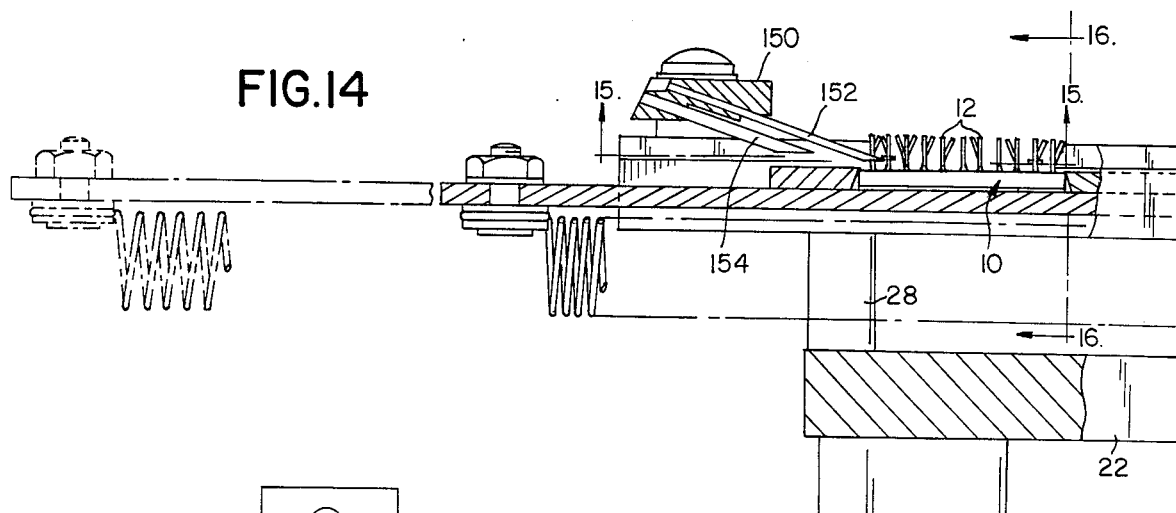
FIG. 14 is a fragmentary side elevational view of a modified form of comb assembly for a PGA straightener in accordance with the present invention.
Figure 15:
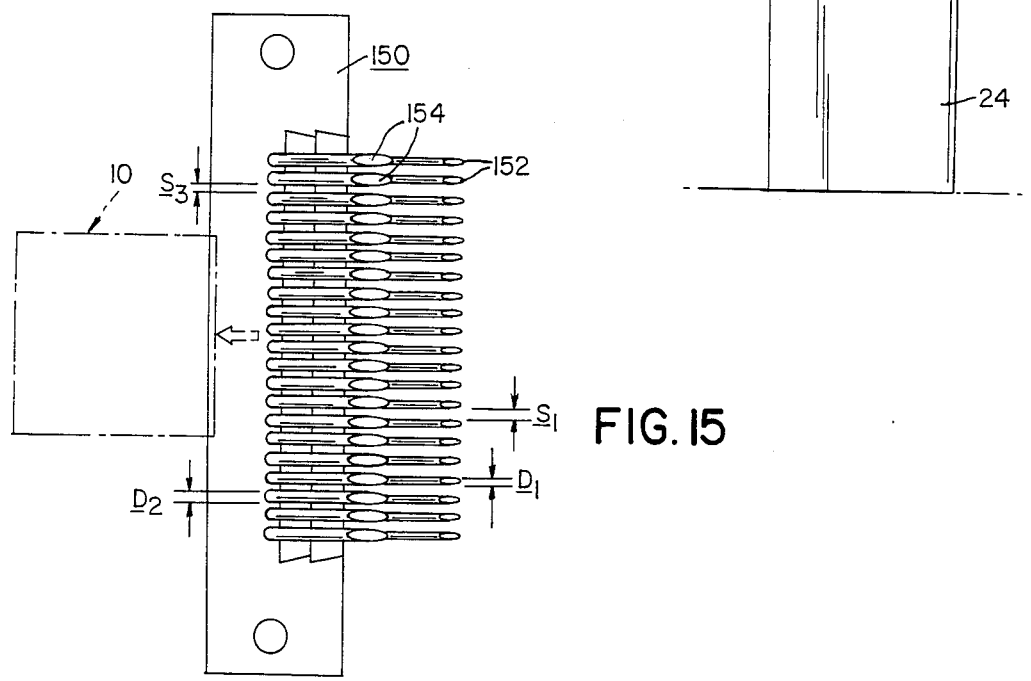
FIG. 15 is a bottom plan view taken on the lines 15—15 of FIG. 14.
Figure 16:
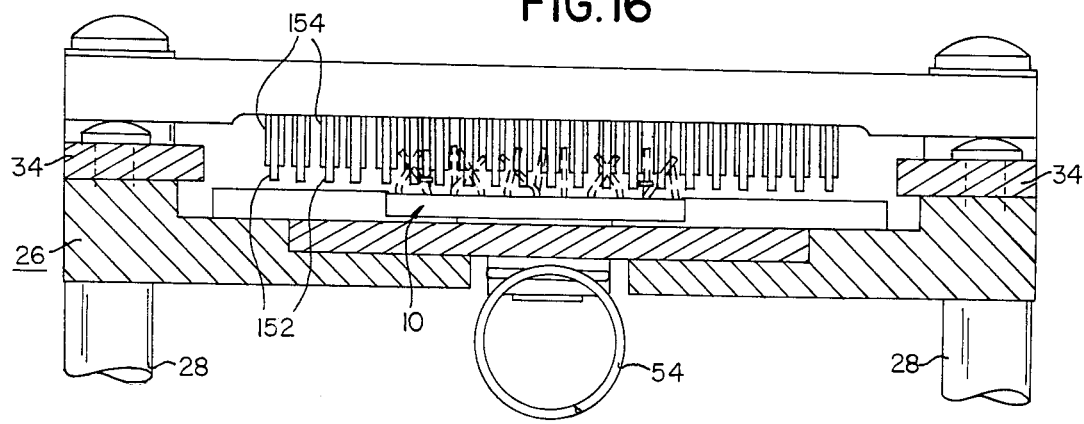
FIG. 16 is an enlarged sectional view taken on lines 16—16 of FIG. 14.

There is illustrated in FIGS. 14–16, a modified version of the comb assembly. The mechanism functions in all other respects in generally the same manner as the principal embodiment described above. However, in this instance, the comb bar 150 mounts two rows of straightening tines 152 and 154, respectively. In the present instance, the longitudinal axis A—A of the tines in each row is aligned as shown in FIG. 15 and the tines in each row, as illustrated, are of circular-shaped cross section. Their outer terminal end faces are elliptical and disposed generally parallel to the face of the body portion of a PGA device. The front row $R_1$ of tines is of smaller diameter $D_1$ than the diameter $D_2$ of the tines in the second row $R_2$. Thus, the spacing $S_1$ between adjacent tines in front row R is greater than the spacing $S_2$ between adjacent tines in the second row $R_2$. It has been found that the use of the smaller tines and the double combing action accommodates the most severe grossly bent pins P. More specifically, the free terminal ends of the tines 152 in the front row project downwardly farther than the free terminal ends of the tines 154 in the second row and are of the smaller cross section so that they can engage and ride below the stand-off shoulders 14 of the PGA device. This arrangement combined with the greater flexibility of the thinner front tines 154 means that they can effectively untangle and pre-straighten grossly bent pins and condition them for final straightening in the larger, more rigid, tines 154 of the second row. Note that the free terminal ends of the rigid tines 154 ride above the stand-off shoulders 14.

Note that in both of the embodiments described, the combing bar is simply mounted on raised posts spanning the cross slide by simple screw fasteners. In this manner the combing bar may be changed when desired or needed depending on the PGA device being processed. Additionally, it facilitates insertion of shims or the like to raise the level of the combing bar when necessary to position the terminal ends of the combing tines at precisely the correct height as illustrated so that the terminal ends of the tines engage slightly above the stand-offs or shoulders and this may vary from one type of PGA device to another.

As described above, the specific clearances and diametral relationships of various parts of the straightening apparatus such as the comb tines and the openings in the grid plates in relation to the PGA pin diameter are important to achieve the desired straightening action. It can also be appreciated that these relationships vary depending on the pin diameter and spacing 9 for a given PGA device. Listed below are typical dimensional relationships for a PGA device wherein the pin diameter $D_p$ is 0.020 in. and the spacing $S_p$ between centers of pins in adjacent rows is 0.100 in.

| | |
|---|---|
| Diameter (D) of comb assembly tine (FIGS. 1–13) | 0.075 in. |
| Minimum spacing (S) between adjacent tines (FIGS. 1–13) | 0.025 in. |
| Tine diameter ($D_1$) of first row ($R_1$) (FIGS. 14–16) | 0.036 in. |
| Minimum spacing ($S_1$) between tines of first row ($R_1$) (FIGS. 14–16) | 0.064 in. |
| Tine diameter ($D_2$) second row ($R_2$) (FIG. 14) | 0.075 in. |
| Minimum spacing ($S_2$) between adjacent tines second row ($R_2$) (FIG. 14) | 0.025 in. |
| Diameter ($D_4$) of movable and fixed grid plate openings | 0.046 in. |
| Entrance diameter ($D_5$) of fixed and movable grid plate openings | 0.07 in. |
| Outer diameter ($D_6$) of posts (including shims) | 0.500 in. |
| Diameter ($D_7$) of movable grid plate post opening | 0.526 in. |
| Radial clearance C between post diameter ($D_6$) and grid plate post opening diameter ($D_7$) | 0.026 in. |

While particular embodiments of the present invention have been illustrated and described herein, it is not intended to limit the invention and changes and modifications may be made therein within the scope of the following claims.

What is claimed is:

1. In apparatus for aligning pins of PGA devices in a predetermined array of parallel rows, a first support surface for the devices so that they can be moved in a predetermined plane, a comb assembly including a plurality of tines disposed in side-by-side spaced parallel array at a predetermined fixed angle to said plane, adjacent tines being spaced apart a distance greater than the maximum cross section of a pin of the PGA device and a slide mechanism for actuating the PGA device through the comb assembly whereby the comb tines engage between the rows of pins in the PGA device and straighten the same by a combing action, said comb tines being oriented relative to the PGA device to engage the pins along substantially their entire length.

2. In apparatus as claimed in claim 1, wherein said comb assembly comprises a bar spaced above the support surface for a PGA device and wherein the tines extend angularly downwardly from said comb bar so that the outer free terminal ends of the tines are aligned with the pins of the PGA device adjacent the juncture of the pins to the top face of the base of the PGA device whereby during actuation of said PGA device through the comb assembly, the pins of the PGA device are engaged along their entire length to effect a straightening action.

3. In apparatus as claimed in 1, wherein the height of the comb assembly above the slide base for the PGA device is selectively adjustable.

4. An apparatus as claimed in claim 1, wherein said slide mechanism comprises a pusher plate mounted for sliding movement in a sliding way having a front edge engageable with an edge of the PGA device and a front guide plate assembly having a guide plate which abuts an opposing edge of the PGA device and biasing means normally urging said slide guide forwardly to position the PGA device at a home position wherein the row of pins adjacent the comb assembly is interengaged with the tines of the comb assembly.

5. In apparatus as claimed in claim 4, wherein the edges of the pusher plate and front guide plate are tapered downwardly rearwardly to thereby capture the PGA device body portion more firmly during actuation through the comb assembly.

6. In apparatus as claimed in claim 4, including means limiting sliding movement of said pusher plate to determine opposite limit positions on either side of said comb assembly.

7. In apparatus as claimed in claim 1, wherein said comb assembly includes two rows of tines wherein the free ends of the rows are spaced apart and parallel to successively engage the pins of a PGA assembly during a combing action.

8. In apparatus as claimed in claim 7, wherein the tines of said first row are of smaller cross section than the tines of said second row and wherein the spacing between adjacent tines of said first row is greater than the spacing between adjacent tines in said second row.

9. An apparatus as claimed in claim 1, wherein said slide mechanism comprises a pusher plate mounted for sliding movement in a sliding way engageable with the PGA device and a front guide plate assembly having a guide plate which confronts an opposing edge of the PGA device and biasing means normally urging said slide guide forwardly to position the PGA device at a home position wherein the row of pins adjacent the comb assembly is interengaged with the tines of the comb assembly.

10. In apparatus as claimed in claim 9, wherein the edges of the pusher plate and front guide plate are configured capture the PGA device body portion firmly during actuation through the comb assembly.

11. In apparatus for straightening pins of PGA devices, at least two grid plates having a series of openings therein of a cross section greater than the cross section of the pins of the PGA device and wherein adjacent openings are located on centers generally equal to the center spacing between adjacent pins of said PGA device and actuator means for moving the plates transversely relative to one another to effect displacement of aligned openings of said plates, said actuator means operable between a rest position wherein the openings of the grid plates are axially aligned and an orbital operative path wherein the openings are offset to straighten the leads and relieve stress in the leads and biasing means normally biasing the actuator means to said rest position.

12. In apparatus as claimed in claim 11, including control mechanism for actuating said movable grid plate relative to the fixed grid plate comprising a control stick mounted for limited universal movement and an elongated control bar connected to the control stick and rotatably connected to the movable grid plate along its length whereby rotary motion of the control stick imparts a circular motion of the grid plates relative to one another.

13. In apparatus as claimed in claim 11, including post members for mounting the grid plates, one of said grid plates being fixedly mounted to said posts, said other movable grid plate having openings therein engageable circumscribing the posts with a predetermined clearance related to the clearance between the diameter of the PGA pins and the openings in the grid plates so that the grid plate openings are only displaceable so that the maximum displacement of the grid plate openings defines an aligned opening between the grid plates slightly greater than the diameter of the PGA pins.

* * * * *